(12) United States Patent
Jan

(10) Patent No.: US 10,156,458 B2
(45) Date of Patent: Dec. 18, 2018

(54) MEASURING CIRCUIT

(71) Applicant: Meggitt SA, Fribourg (CH)

(72) Inventor: Patrick Jan, Cousset (CH)

(73) Assignee: MEGGITT SA (CH)

( * ) Notice: Subject to any disclaimer, the term of this patent is extended or adjusted under 35 U.S.C. 154(b) by 175 days.

(21) Appl. No.: 15/425,038

(22) Filed: Feb. 6, 2017

(65) Prior Publication Data

US 2017/0227381 A1 Aug. 10, 2017

(30) Foreign Application Priority Data

Feb. 8, 2016 (EP) ..................................... 16154622

(51) Int. Cl.
*G01D 5/24* (2006.01)
*G01D 11/24* (2006.01)
(Continued)

(52) U.S. Cl.
CPC ............. *G01D 5/24* (2013.01); *G01D 11/245* (2013.01); *G01H 1/003* (2013.01); *G01H 11/08* (2013.01); *G01P 15/09* (2013.01); *G01P 21/00* (2013.01); *G01R 27/2605* (2013.01); *G01D 5/2405* (2013.01); *G01R 27/26* (2013.01)

(58) Field of Classification Search
CPC ........ G01D 5/24; G01D 5/2405; G01D 5/241; G01D 5/2412; G01D 5/2417; G01D 11/00; G01D 11/24; G01D 11/245; G01R 27/00; G01R 27/02; G01R 27/26; G01R 27/2605; G01H 1/003; G01H 1/08; G01L 1/16; G01L 25/00; G01P 15/09; G01P 21/00; H01L 41/113

USPC ....... 324/600, 649, 658, 660, 661, 662, 663, 324/665, 679, 684, 686, 76.11, 123 R, 324/123 C
See application file for complete search history.

(56) References Cited

U.S. PATENT DOCUMENTS 6,498,501 B2 12/2002 Broillet .......................... 324/727
9,213,184 B2 * 12/2015 Tsai ........................ G02B 26/10
(Continued)

OTHER PUBLICATIONS

European Search Report dated Aug. 2, 2016 in corresponding European Patent Application No. EP 16154622.

*Primary Examiner* — Hoai-An D. Nguyen
(74) *Attorney, Agent, or Firm* — Ostrolenk Faber LLP

(57) ABSTRACT

A measuring circuit comprising a sensing element configured to generate a measuring signal from a measuring object, a signal injector configured to generate an auxiliary signal, and an evaluation circuit comprising a first upstream amplifier with a first input connected to a first pole of the sensing element via a first signal line and a second upstream amplifier with a first input connected to a second pole of the sensing element via a second signal line. A measuring circuit with an improved reliable control of its measuring chain allowing continuous testing of the integrity of the measurement signal coming from the sensing element and/or to allow the measuring circuit to be upgradable with respect to a different sensing unit and/or evaluation unit, the first upstream amplifier comprises a second input connected to the signal injector, and the evaluation circuit comprises a first downstream amplifier having a first input connected to the signal injector and a second input connected to an output of the first upstream amplifier.

15 Claims, 3 Drawing Sheets

(51) Int. Cl.
  *G01R 27/26* (2006.01)
  *G01H 1/00* (2006.01)
  *G01H 11/08* (2006.01)
  *G01P 15/09* (2006.01)
  *G01P 21/00* (2006.01)

(56) References Cited

U.S. PATENT DOCUMENTS

| | | | |
|---|---|---|---|
| 2005/0145030 A1* | 7/2005 | Elliott | G01D 5/24 |
| | | | 73/514.18 |
| 2009/0013785 A1 | 1/2009 | Yoshida et al. | 73/514.16 |
| 2009/0322183 A1* | 12/2009 | Kawakubo | G01C 19/5621 |
| | | | 310/329 |
| 2012/0285244 A1* | 11/2012 | Kim | G01C 25/005 |
| | | | 73/504.12 |
| 2014/0060209 A1 | 3/2014 | Broillet et al. | 73/862.68 |
| 2014/0225634 A1 | 8/2014 | Broillet | 324/750.01 |
| 2018/0052055 A1* | 2/2018 | Ikeda | G01J 1/02 |

* cited by examiner

MEASURING CIRCUIT

The present invention relates to measuring circuit comprising a sensing element configured to generate a measuring signal from a measuring object, a signal injector configured to generate an auxiliary signal, and an evaluation circuit comprising a first upstream amplifier with a first input connected to a first pole of the sensing element via a first signal line and a second upstream amplifier with a first input connected to a second pole of the sensing element via a second signal line.

A measuring circuit of that type is known from U.S. Pat. No. 6,498,501 B2. The measuring circuit comprises a symmetric arrangement of two signal lines connecting the sensing element to a measurement amplifier and to a fault indicating signal amplifier. The measuring element delivers symmetric input signals to these amplifiers. The measurement amplifier delivers a measuring signal representing the difference of its input signals. The fault indicating signal amplifier delivers a fault indicating signal representing the sum of the input signals. The sensing element of this circuit is provided by a piezoelectric transducer.

An auxiliary signal generated by the signal injector is injected to the terminals of the piezoelectric transducer via an additional test signal injection line. The sensing circuit further comprises two injection capacitors connected in parallel to the piezoelectric transducer. Both injection capacitors are connected to the separate test signal injection line such that the auxiliary test signal can be injected from the output of the signal injector into the sensing circuit by means of the signal injection capacitors via the test signal injection line. The test signal is then transmitted from the injection points to the evaluation circuit via a respective signal line. This enables the measuring circuit to evaluate the quality of the measuring circuit not only during operation of the monitored vibration machine but also when the vibration machine is at rest. In this way, a permanent surveillance of the measuring circuit can be achieved. By harvesting the positive and negative charges from the piezoelectric element on two separate asymmetrical charge amplifiers and then subtracting one from the other on a third amplifier, two main advantages are attained. The first is a high Common-Mode Rejection Ratio (CMRR), the second is a low noise level.

However, in spite of these advantageous features, this circuit suffers from some disadvantages. In particular, the circuit requires an additional conductor dedicated to the test signal to be connected to the sensing element. Because of this additional conductor, the circuit cannot be retrofitted to an already implemented measuring chain without replacing the sensor. Beyond that, a third connector generates additional complexity to the sensor and cable design and manufacturing, thus generating higher costs and impacting its reliability due to the higher amount of components.

It is an object of the present invention to remedy at least one of the above mentioned disadvantages and to provide the initially addressed measuring circuit with an improved reliable control of its measuring chain allowing continuous testing of the integrity of the measurement signal coming from the sensing element, in particular all the while during performing the actual measurements on the sensing element. It is a further object to allow identifying the origin of a measurement problem within the measuring circuit, in particular a separate testing capability for the signal lines and/or the sensing element and/or the remaining electronic components. It is another object to provide the initially addressed measuring circuit with the capability to be upgradable with respect a to different sensing unit and/or evaluation unit, in particular a new testing and/or evaluation circuitry, wherein no modification on the already existing sensing element and/or the already existing signal lines is needed, in particular with the possibility to retrofit the measuring circuit such that no replacement and/or no modification of the sensing element and/or the signal lines is required.

At least one of these objects is achieved by the measuring circuit according to claim 1. The dependent claims define preferred embodiments.

Accordingly, the invention suggests that the first upstream amplifier comprises a second input connected to the signal injector. The evaluation circuit further comprises a first downstream amplifier having a first input connected to the signal injector and a second input connected to an output of the first upstream amplifier. Thus, no additional signal line, in particular no third signal line, for the provision of the auxiliary signal generated by the signal injector from the signal injector to the sensing element is necessary and can be omitted.

On the one hand, the reliability of the measuring circuit can be improved this way by reducing the circuit's complexity, in particular within the rather sensitive range of the sensing element. More particularly, when working in very harsh environments as typically encountered in the monitoring of rotating machinery, such as an engine of an airplane or a land based turbine, a more reliable and/or cost effective solution for such environments which for instance wouldn't require a rather complex computation hardware and/or software can thus be provided. On the other hand, the reduction of the circuit's complexity, in particular within the range of the sensing element by an omission of the additional signal line for the provision of the auxiliary signal, allows an upgrade of the sensing element and/or signal lines of an already employed measuring circuit to a measuring circuit according to the invention and/or an integration of a measuring circuit according to the invention into a measuring circuit that already has been put into operation.

At the same time, the present invention allows to ensure high quality measurements in particular by employing the above described advantageous wiring of the first and second upstream amplifier and the downstream amplifier. In particular, it can ensure very low noise levels and very good common mode rejection. It can also provide a reliable failure identification. Preferably, at least one output of a respective output of the first and second upstream amplifier and the first downstream amplifier is employed as a failure identification source. In particular, at least an output of the first downstream amplifier is preferably employed for this purpose. More preferred, at least two different of these outputs producing a substantially different output signal in response to an auxiliary signal generated by the signal injector are employed as a failure identification source. Most preferred, an output of each the first and second upstream amplifier and the first downstream amplifier is employed as a failure identification source.

The poles of the sensing element are preferably connected to a respective electrode configured to collect charge signals generated from the sensing element and/or introduced to the sensing element. Preferably, the first pole of the sensing element is connected to a first electrode and the second pole of the sensing element is connected to a second electrode. Preferably, the electrodes are arranged at the poles of the sensing element. Preferably, the electrodes are adapted to collect opposite charges, more particularly positive charges and negative charges. In particular, at least one of the poles is preferably connected to a positive electrode adapted to collect positive charges and at least one of the poles is preferably connected to a negative electrode adapted to collected negative charges. Preferably, each of the electrodes can be employed as a positive and a negative electrode. A capacitance in between the electrodes connected to the poles of the sensing element is subsequently referred to as sensing capacitance.

Preferably, the second upstream amplifier comprises a second input not connected to the signal injector. According to a first preferred configuration, the second input of the second upstream amplifier is connected to ground. According to a second preferred configuration, the second input of the second upstream amplifier is connected to a second signal injector being different from the signal injector to which the second input of the first upstream amplifier is connected. Preferably, the second signal injector is configured to provide a test signal in a different frequency range than the test signal provided by the signal injector connected to the second input of the first upstream amplifier. In this way, the failure identification method according to the invention can be advantageously duplicated and/or superposed in one circuit by applying at least two different test signals generated by the different signal injectors in the circuit.

Preferably, the evaluation circuit comprises a second downstream amplifier. The second downstream amplifier preferably has a first input connected to an output of the second upstream amplifier. In particular, the second downstream amplifier preferably has a first input connected to an upstream amplifier to which the signal injector is not connected. The second downstream amplifier preferably has a second input connected to an output of the first downstream amplifier. A circuitry comprising the second downstream amplifier in the above described manner can further increase the failure detection reliability. In particular, at least an output of the second downstream amplifier is preferably employed as a failure identification source.

In the context of this application, an amplifier is preferably defined as a component comprising at least one input to which a respective input signal, in particular a voltage, can be provided and at least one output providing an output signal, in particular a voltage, from at least one of the input signals, in particular in the form of an amplified signal. A differential amplifier is preferably defined as an amplifier with two inputs, in particular an inverting input and a non-inverting input, and an output providing an output signal representative for a difference between a respective input signal at the two inputs. The first input of a respective differential amplifier preferably corresponds to one of an inverting input delivering an inverted signal and a non-inverting input delivering a non-inverted signal. The second input of a respective differential amplifier preferably corresponds to the other of the inverting input and non-inverting input. In particular, the inverting input is preferably configured to provide the additive inverse of an incoming signal value. The non-inverting input is preferably configured to provide a signal value with an algebraic sign substantially corresponding to an incoming signal value. The output signal is then preferably representative for a sum of these signal values provided by the inverting input and the non-inverting input. A summing amplifier is preferably defined as an amplifier with a first input and a second input, and an output providing an output signal representative for a sum of an input signal at the first input and an input signal at the second input.

According to a preferred implementation, at least one amplifier, in particular at least one differential amplifier, is provided as an operational amplifier in which a retroaction in between at least one of its inputs and its output is provided. In particular, a feedback resistance and/or feedback capacitance and/or other feedback component may be provided in a parallel connection between at least one of the inputs and the output of the operational amplifier in order to provide the retroaction. Thus, the strength of a feedback signal at the output of the operational amplifier, in particular an output signal representative for a difference between a respective input signal at its two inputs, is preferably modulated by this retroaction. In this implementation or according to another preferred implementation, at least one amplifier, in particular at least one differential amplifier, is provided as a non-retroaction amplifier in which substantially no retroaction in between its inputs and its output is provided.

Preferably, at least one of the first upstream amplifier and second upstream amplifier comprises a differential amplifier. More preferred, the first upstream amplifier and second upstream amplifier each comprise a differential amplifier. The first input of the first upstream amplifier and/or second upstream amplifier preferably corresponds to one of the inverting input and non-inverting input of the respective differential amplifier. The second input of the first upstream amplifier and/or second upstream amplifier preferably corresponds to the other input of to the inverting input and non-inverting input of the respective differential amplifier. According to a preferred configuration, the first signal line and second signal line are connected to a corresponding input of the inverting input or non-inverting input of the respective differential amplifier. Preferably, the differential amplifier of at least one of the first upstream amplifier and second upstream amplifier or of both upstream amplifiers is provided as an operational amplifier in which the output signal is modulated by a retroaction.

Preferably, the first downstream amplifier comprises a differential amplifier. The first input of the first downstream amplifier preferably corresponds to one of the inverting input and non-inverting input of the differential amplifier. The second input of the first downstream amplifier preferably corresponds to the other input of to the inverting input and non-inverting input of the respective differential amplifier. Preferably, the signal injector is connected to a different input of the inverting input and non-inverting input of the respective differential amplifier at the first downstream amplifier than at the first upstream amplifier. Preferably, the second downstream amplifier comprises a differential amplifier. The first input of the first downstream amplifier preferably corresponds to one of the inverting input and non-inverting input of the differential amplifier. The second input of the first downstream amplifier preferably corresponds to the other input of the inverting input and non-inverting input of the respective differential amplifier. The second downstream amplifier is preferably configured to provide an output signal at an output substantially corresponding to a difference of two input signals, in particular at the inverting input and non-inverting input, divided by two. Preferably, the differential amplifier of at least one of the first downstream amplifier and second downstream amplifier or of both downstream amplifiers is provided as a non-retroaction amplifier in which the output signal is substantially not modulated by a retroaction.

According to a preferred configuration, the evaluation circuit comprises a summing amplifier. The first input of the summing amplifier is preferably connected to an output of the second upstream amplifier. The second input of the summing amplifier is preferably connected to an output of the first downstream amplifier. A circuitry comprising the summing amplifier in the above described manner can further increase the failure detection reliability and/or reduce the complexity of signal evaluation. At least an output of the summing amplifier is preferably employed as a failure identification source.

According to a preferred configuration, the evaluation circuit comprises at least one entry capacitance connected to at least one of the first signal line and second signal line, preferably upstream of an input, in particular the first input, of at least one of the first upstream amplifier and second upstream amplifier. More preferred, a respective entry capacitance is connected to both the first signal line and second signal line. Preferably, the entry capacitance is connected to ground. Preferably, the entry capacitance is provided substantially at the input of the respective upstream amplifier. The entry capacitance can advantageously be employed from the evaluation circuit in order to check substantially the entire circuit. In particular, the entry capacitance may additionally be used for another purpose, in particular may be part of another electronic component of the measuring circuit such as a filter.

Preferably, at least one feedback capacitance is connected in parallel to at least one of the first upstream amplifier and second upstream amplifier. More preferred, a respective feedback capacitance is connected in parallel to the first upstream amplifier and to the second upstream amplifier. Preferably, the feedback capacitances are connected in parallel starting from a branching point substantially at an input of the respective amplifier to a branching point substantially at an output of the respective amplifier. The branching point at an input of the respective amplifier is preferably located at the input to which at least one of the first and second signal line is connected. Thus, charges generated from the sensing element can be fed to the respective feedback capacitance and generate a voltage at the respective amplifier. According to a preferred configuration, the branching point at an input of the respective amplifier is located at the inverting input of the respective differential amplifier. Preferably, the values of the feedback capacitances connected in parallel to the first upstream amplifier and to the second upstream amplifier are substantially identical. In this way, a good common-mode rejection ratio can be achieved.

Preferably, the measuring circuit comprises a sensing unit including the sensing element. Preferably, the measuring circuit comprises an evaluation unit including the evaluation circuit. Preferably, the measuring circuit comprises an output terminal. Preferably, the sensing unit and evaluation unit are connectable to one another via the output terminal. In this way, the sensing unit is preferably removable from the evaluation unit, in particular replaceable by connecting another sensing unit to the evaluation unit. This advantage can be in particular achieved due to the above described circuitry comprising no separate third signal line for connecting the signal injector to the sensing element. Preferably, the output terminal comprises a separate connector for the first signal line and/or a separate connector for the second signal line.

Preferably, the sensing unit comprises a sensor housing in which the sensing element is arranged. Preferably, the sensing element is arranged in such a way in the sensor housing that a capacitance, subsequently referred to as housing capacitance, is provided in between each of the poles of the sensing element and the sensor housing. Preferably, the sensor housing is connected to ground. According to a preferred configuration, the evaluation circuit is not included in the sensor housing. This allows an easy installation of the sensing element to the evaluation circuit and/or removal of the sensing element from the evaluation circuit.

It is also conceivable, however, that at least part of the evaluation unit, for instance the first upstream amplifier and/or second upstream amplifier, is included in the sensor housing and/or close to the sensing element.

According to a preferred configuration, the first signal line and second signal line are at least partially included in at least one cable, more preferred a common cable. The cable preferably comprises at least partially a cable sheath. Preferably, the first signal line and second signal line are at least partially arranged in such a way in the cable that a capacitance, subsequently referred to as sheath capacitance, is provided in between each of the signal lines and the cable sheath. The first signal line and second signal line are preferably at least partially arranged in such a way in the cable that a capacitance, subsequently referred to as line capacitance, is provided in between the signal lines. Preferably, the cable comprises at least partially a mineral insulated (MI) cable and/or cable connection. Preferably, the MI cable and/or cable connection is arranged in between the sensing element, more particularly the sensor housing, and the output terminal.

At least one of the first signal line and second signal line is preferably at least partially provided with a separate electromagnetic shield. The cable preferably comprises at least partially a separate electromagnetic shield for at least one signal line, more preferred for each signal line, in particular a first shield for the first signal line and/or a second shield for the second signal line. Preferably, the shields for each signal line are at least partially surrounded by a common cable sheath. Preferably, the first shield and/or second shield are at least partially arranged in such a way in the cable that a capacitance, subsequently referred to as shield capacitance, is provided in between each shield and the respective signal line. In this case, a substantially negligible capacitance is preferably provided in between the signal lines and/or in between the shields and/or in between the signal lines and the cable sheath. Preferably, the cable sheath is connected to ground. Preferably, the cable comprising at least one shield is at least partially provided as a medium to low noise (MTLN) cable. Preferably, the MTLN cable is arranged in between the output terminal and the evaluation unit. Alternatively or additionally, the MTLN cable is arranged in between the sensing element, more particularly the sensor housing, and the output terminal.

According to a preferred configuration, the first signal line and second signal line are partially included in at least one MI cable and/or partially included in at least one MTLN cable. Preferably, the sensing unit comprises the MI cable and/or MTLN cable. Preferably, the evaluation unit comprises the MTLN cable. It is understood that it is also conceivable, for instance, that the first signal line and/or second signal line are at least partially included in only an MI cable or only an MTLN cable or a different cable type or a combination of different cable types. In particular, according to another preferred configuration, substantially no cable is provided in which the first signal line and second signal line would be included. In this configuration the sensing element is preferably located in proximity to the evaluation circuit. In particular, the sensing element and evaluation circuit may be enclosed by a common housing and/or the evaluation circuit may be substantially directly connected to the sensing element.

Preferably, the evaluation circuit is configured with logic to evaluate a value derived from a signal, in particular a voltage, obtained downstream of at least one of the first downstream amplifier, the second downstream amplifier, the first upstream amplifier, and the second upstream amplifier.

Said signal obtained downstream of the respective amplifier may comprise a signal obtained from an output of the respective amplifier or downstream of an output of the respective amplifier. In particular, the evaluation circuit is preferably configured with logic to evaluate a value derived from a signal, in particular a voltage, at an output or downstream of an output of at least one of the first downstream amplifier and second downstream amplifier.

According to a preferred configuration, the evaluation circuit is configured with logic to evaluate a value derived from a signal, in particular a voltage, at an output or downstream of an output of both the first downstream amplifier and second downstream amplifier. According to a preferred configuration, the evaluation circuit is configured with logic to compare a value derived from a signal, in particular a voltage, at an output or downstream of an output of the first downstream amplifier with a value derived from a signal, in particular a voltage, at an output or downstream of an output of the second downstream amplifier.

According to a preferred configuration, the evaluation circuit is configured with logic to evaluate a value derived from a signal, in particular a voltage, at an output or downstream of an output of the summing amplifier. According to a preferred configuration, the evaluation circuit is configured with logic to compare a value derived from a signal, in particular a voltage, at an output or downstream of an output of the second downstream amplifier with a value derived from a combination of values derived from a signal, in particular a voltage, at an output or downstream of an output of the summing amplifier and at an output or downstream of an output of at least one of said first upstream amplifier and second upstream amplifier.

Preferably, the evaluation circuit comprises a post processing unit. Preferably, an output of at least one of the first upstream amplifier, second upstream amplifier, the first downstream amplifier, second downstream amplifier, and summing amplifier is connected to the post processing unit. More preferred, an output of at least one of the first and second upstream amplifier and an output of at least one of the first and second downstream amplifier is connected to the post processing unit. The post processing unit is preferably configured with logic to dissociate measurement signals generated by the sensing element from test signals generated by the signal injector. The post processing unit is preferably configured with logic to evaluate output signals from the output of amplifiers connected to the post processing unit.

Preferably, the evaluated value from an output signal of at least one of the first upstream amplifier, second upstream amplifier, first downstream amplifier, second downstream amplifier, and summing amplifier indicates a change of at least one of and/or a combination of the sensing capacitance, line capacitance, housing capacitance, sheath capacitance, shield capacitance, feedback capacitance, and entry capacitance of at least one of the first signal line and second signal line.

Preferably, the evaluated value from an output signal of at least one of the first upstream amplifier, second upstream amplifier, first downstream amplifier, second downstream amplifier, and summing amplifier is related to a combination of signals, in particular a sum of signals. The signals are preferably provided as a voltage. At least part of the signals are preferably related to a voltage drop across a capacitance, in particular at least one of the sensing capacitance, line capacitance, housing capacitance, sheath capacitance, shield capacitance, feedback capacitance, and entry capacitance of at least one of the first signal line and second signal line.

The combination of signals evaluated from an output or downstream of an output of at least one of said amplifiers preferably comprises a signal $U_{vib}$ generated by the sensing element. The combination of signals evaluated from an output or downstream of an output of at least one of said amplifiers preferably comprises a signal $U_t$ generated by the signal injector. The combination of signals evaluated from an output or downstream of an output of at least one of said amplifiers preferably comprises a signal $U_{C3}$ representative of a capacitance value C3 of a capacitance in between the first signal line and the second signal line. In particular, the capacitance value C3 may comprise at least one of a capacitance value C13 of the sensing capacitance and a capacitance value C23 of the line capacitance, or a combination thereof.

The combination of signals evaluated from an output or downstream of an output of at least one of said amplifiers preferably comprises a signal $U_{C2}$ representative of a capacitance value C2 of a capacitance in between one of the signal lines, in particular the first signal line, and surroundings of this signal line. In particular, the capacitance value C2 may comprise at least one of a capacitance value C12 of the housing capacitance, a capacitance value C22 of the sheath capacitance, a capacitance value C42 of the shield capacitance of the respective signal line, or a combination thereof. The combination of signals evaluated from an output or downstream of an output of at least one of said amplifiers may comprise a signal $U_{C1}$ representative of a capacitance value C1 of a capacitance in between one of the signal lines, in particular the second signal line, and surroundings of this signal line. In particular, the capacitance value C1 may comprise at least one of a capacitance value C11 of the housing capacitance, a capacitance value C21 of the sheath capacitance, a capacitance value C41 of the shield capacitance of the respective signal line, or a combination thereof.

According to a preferred configuration, the evaluation circuit is configured with logic to evaluate a value derived from a signal from at least one of an output or downstream of an output of the first upstream amplifier, the signal corresponding to $$U_{Output52}=U_{vib}+U_t+U_{C2}+U_{C3}, \text{ or } U_{Output52}=-U_{vib}-U_t-U_{C2}-U_{C3};$$

an output or downstream of an output of the second upstream amplifier, the signal corresponding to $$U_{Output51}=-U_{vib}-U_{C3}, \text{ or } U_{Output51}=U_{vib}+U_{C3}; \text{ and}$$

an output or downstream of an output of the first downstream amplifier, the signal corresponding to $$U_{Output53}=U_{vib}+U_{C2}+U_{C3}, \text{ or } U_{Output53}=-U_{vib}-U_{C2}-U_{C3}.$$

Preferably, the evaluation circuit is configured with logic to evaluate a value derived from at least two of these output signals, more preferred all of these output signals.

Preferably, at least one of the feedback capacitances is connected to the first upstream amplifier in such a way that the signal $U_{C2}$ representative of capacitance C2 corresponds to $$U_{C2}=C2 \times U_t/C51,$$

wherein C51 corresponds to the value of this feedback capacitance. Preferably, the signal $U_{C3}$ representative of capacitance C3 then corresponds to $$U_{C3}=C3 \times U_t/C51.$$

In consequence, the output signal of the first upstream amplifier may correspond to $$U_{Output52} = U_{vib} + U_t + U_{C2} + U_{C3} = U_{vib} + U_t + \frac{C3 \times U_t}{C51} + \frac{C2 \times U_t}{C51}.$$

The output signal of the second upstream amplifier may correspond to $$U_{Output51} = -U_{vib} - U_{C3} = -U_{vib} - \frac{C3 \times U_t}{C51}.$$

The output of the first downstream amplifier may correspond to $$U_{Output53} = U_{vib} + U_{C2} + U_{C3} = U_{vib} + \frac{C2 \times U_t}{C51} + \frac{C3 \times U_t}{C51}.$$

Moreover, the output of the second downstream amplifier may correspond to $$U_{Output54} = U_{vib} + U_t \times \frac{C3 + C2/2}{C51}.$$

It is understood, that also the inverse of these output signals is conceivable.

Preferably, the evaluation circuit is configured with logic to identify at least one of the following failures, in particular based on the above described evaluation:
  a disconnection of the sensing element;
  a disconnection of a cable, in particular the MTLN cable;
  a saturation of at least one amplifier;
  a loss of a connection to ground; and
  an open circuit, in particular in between a cable connection.

More preferred, all these failures are identifiable by the evaluation unit.

In another preferred configuration, in which the evaluation unit may be substantially directly connected to the sensing element, in particular in which substantially no cable may be provided in which the first signal line and second signal line would be included, substantially no sheath capacitance and/or substantially no shield capacitance and/or substantially no line capacitance may be present in the circuit. Preferably, the signal $U_{C3}$ is directly representative for the sensing capacitance, in particular the sensing capacitance value C13. The signal $U_{C2}$ is preferably directly representative for the housing capacitance value C12. The signal $U_{C1}$ is preferably directly representative for the housing capacitance value C11. In particular, line capacitance value C23, sheath capacitance values C21, C22, and shield capacitance values C41, C42 may be nonexistent or negligible in this case. It is understood that many other configurations are conceivable, for instance a configuration in which substantially no sheath capacitance and/or substantially no shield capacitance but at least one line capacitance, at least one housing capacitance and at least one sensing capacitance may be present in the circuit.

Possible application areas of the above described measuring circuit comprise a vibration sensor, an accelerometer, a pressure sensor, an acoustic emission sensor or similar sensing devices. In the case of a vibration sensor, the measuring object preferably comprises a rotary machine or any other vibrating structure operatively connected to the sensing element. In particular, the measuring circuit according to the invention is employed to detect at least one of vibrations and rotations. The measuring object can be constituted for instance by an engine of an airplane or a land based turbine such as a gas or steam turbine, or any other vibrating structure. In the case of an accelerometer, the measuring object preferably comprises a seismic mass that is mechanically coupled to the sensing element. In the case of a pressure sensor, the measuring object preferably comprises a gas and/or liquid which can for instance be operatively connected to the sensing element via a membrane. In the case of an acoustic emission sensor, the measuring object preferably comprises an emission source of acoustic waves that can be detected by the sensing element. The sensing element of the circuit is preferably provided by a piezoelectric transducer. Preferably, the transducer is provided with two separate electrodes connected to a respective pole providing charge signals, in particular corresponding to vibrations and/or rotations of the measuring object.

The invention is explained in more detail hereinafter by means of preferred embodiments with reference to the drawings which illustrate further properties and advantages of the invention. The figures, the description, and the claims comprise numerous features in combination that one skilled in the art may also contemplate separately and use in further appropriate combinations. In the drawings:

Figure 1:
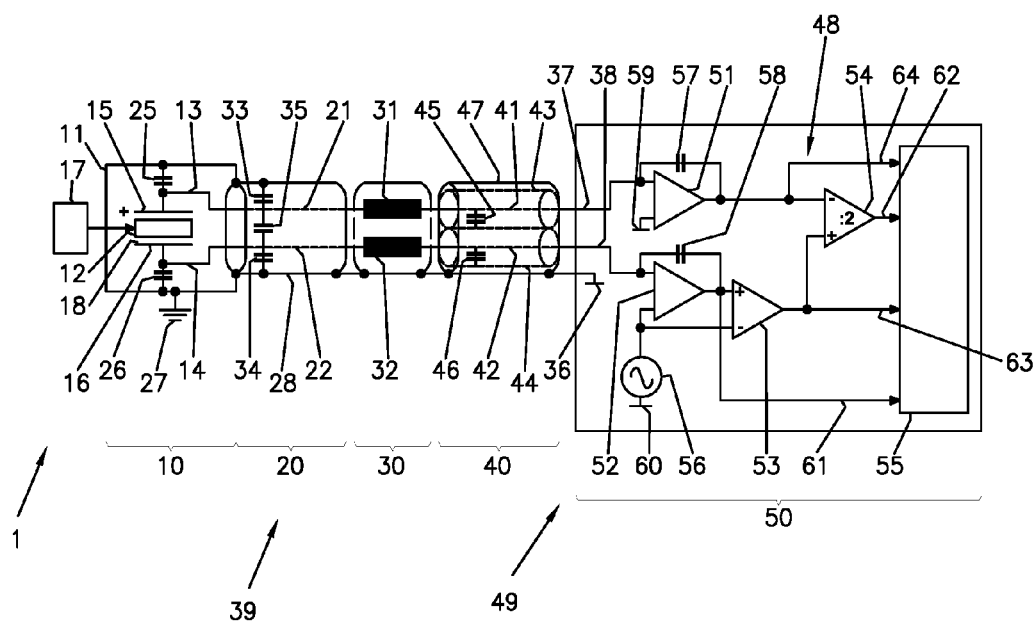
FIG. 1 is a schematic representation of a measuring circuit according to a first embodiment.

A basic embodiment of a measuring circuit 1 is shown in FIG. 1. Measuring circuit 1 comprises a sensor 10, a mineral insulated (MI) cable connection 20, an output terminal 30, a medium to low noise (MTLN) cable 40 and an electronic measuring unit 50. Sensor 10 can be, for instance, any type of a piezoelectric sensor. Sensor 10 comprises a sensor housing 11 and a sensing element 12, in particular a piezoelectric sensing element. Sensing element 12 comprises a positive and a negative pole 15, 16 at which a positive and a negative electrode is arranged, respectively, serving as a pick-up for charges generated by sensor 10. Sensing element 12 is operatively connected to a measuring object 17 and configured to generate charges corresponding to a measuring signal from measuring object 17. A sensing unit 39 comprises sensor 10 and MI cable 20. An evaluation unit 49 comprises MTLN cable 40 and electronic measuring unit 50. Electrodes 15, 16 are connected by two conductors 13, 14 and MI cable 20 to output terminal 30. Both poles 15, 16 of sensing element 12 are insulated from housing 11 (the sensing element is electrically floating). Sensing element 12 has an internal capacitance 18 of a value C13. A capacitance 25, 26 in between a respective wire of conductors 13, 14 and housing 11 has a value C11 and C12, respectively. Sensor 10 is connected to the ground 27.

MI cable 20 comprises two conductors 21, 22 connected to conductors 13, 14 of sensor 10. In this case, they are not separately shielded from one another. MI cable 20 further comprises a cable sheath 28 in the form of an electromagnetic shield. A respective capacitance 33, 34 between conductors 21, 22 and shield 28 has a value C21 and C22, respectively. A capacitance 35 in between the conductors 21, 22 has a value C23.

Conductors 21, 22 form a respective line leading to output terminal 30, which transitions from MI cable 20 coming from sensor 10 to MTLN cable 40. MTLN cable 40 goes from output terminal 30 to electronic measuring unit 50. MTLN cable 40 comprises two conductor cables 41, 42 shielded from one another. Capacitances 45, 46 between each conductor 41, 42 and a respective electromagnetic shield 43, 44 have a value C41 and C42, respectively. MTLN cable 40 further comprises a cable sheath 47 enclosing conductors 41, 42 and respective shields 43, 44. Cable sheath 47 is also provided as an electromagnetic shield. Shield 47 is connected to ground 36. Output terminal 30 comprises respective connectors 31, 32 connecting conductors 21, 22 of MI cable 20 to conductor cables 41, 42 of MTLN cable 40.

First conductor 14 of sensor 10, first conductor 22 of MI cable 20, first connector 32 of output terminal 30, and first conductor 42 of MTLN cable 40 are thus connected to one another and form a first signal line 38 leading from first electrode 16 of sensor 10 to electronic measuring unit 50. Second conductor 13 of sensor 10, second conductor 21 of MI cable 20, second connector 31 of output terminal 30, and second conductor 41 of MTLN cable 40 are thus connected to one another and form a second signal line 37 leading from second electrode 15 of sensor 10 to electronic measuring unit 50.

Electronic measuring unit 50 comprises an evaluation circuit 48. Evaluation circuit 48 comprises four amplifiers 51, 52, 53, 54 and a processing unit 55. The amplifiers comprise a first upstream amplifier 52, a second upstream amplifier 51, a first downstream amplifier 53, and a second downstream amplifier 54. First upstream amplifier 52 comprises a first input connected to first signal line 38. First upstream amplifier 52 is a differential amplifier with an inverting input provided by its first input and a non-inverting input provided by a second input. Second upstream amplifier 51 comprises a first input connected to second signal line 37. Second upstream amplifier 51 is also a differential amplifier with an inverting input provided by its first input and a non-inverting input provided by a second input.

A signal injector 56, in particular a signal generator, provides the test signal needed. Signal generator 56 is connected to ground 60. The second input of first upstream amplifier 52 is connected to signal generator 56. The second input of second upstream amplifier 52 is connected to ground 59. First downstream amplifier 54 has a first input connected to signal injector 56 and a second input connected to an output of first upstream amplifier 52. Second downstream amplifier 54 has a first input connected to an output of second upstream amplifier 52 and a second input connected to an output of first downstream amplifier 53. First downstream amplifier 53 and second downstream amplifier 54 are also provided by a respective differential amplifier with an inverting input corresponding to its first input and a non-inverting input corresponding to its second input.

A respective feedback capacitance 57, 58 is connected in parallel to upstream amplifiers 51, 52. The value of feedback capacitance 57 and 58 is C51 and C52, respectively. To get a good Common-Mode Rejection Ratio, capacitances C51 and C52 should be identical. The shown arrangement of four amplifiers 51, 52, 53, 54 shows one of the ways the invention can be implemented. In particular, amplifiers 51-54 each form a differential amplifier. Upstream amplifiers 51, 52 each form an operational amplifier in which a retroaction takes place via feedback capacitances 57, 58 connected in between one of its inputs and the output of the respective amplifier 51, 52. Downstream amplifiers 53, 54 each form a non-retroaction amplifier in which no retroaction is provided in between the inputs and the output of the respective amplifier 53, 54. Using at least three amplifiers allows for a very low noise level and a very good CMMR.

The amplitude of the auxiliary test signal generated by signal injector 56 has a value $U_t$. $U_t$ can be chosen freely within wide limits as long as it doesn't overload the measuring electronic. For continuous use of the BITE, the frequency however should be chosen outside the bandwidth of the measuring signal since the voltage created by 56 will always be there. The test frequency can also be within the bandwidth of the sensing element as long as the selected frequency isn't actively used for measurements.

The charges generated from sensing element 12 have a value Qvib. The generated charges will end up on feedback capacitances 57, 58 with the values C51, C52 and will generate a voltage Uvib=Qvib/C51 (=Qvib/C52). The output of first upstream amplifier 52, second upstream amplifier 51, first downstream amplifier 53, and second downstream amplifier 54 is connected to post processing unit 55 via a respective output channel 61, 62, 63, 64. Processing unit 55 will dissociate the measurement signal provided by sensing element 12 from the test signal provided by signal injector 56 and analyze the output values obtained from the different amplifiers 51, 52, 53, 54. The results of this analysis will provide information as to the nature and location of the failure. The mechanism used is described hereafter.

The above described values of capacitances in measuring circuit 1 comprise values for sensing capacitance C13, line capacitance C23, housing capacitances C11, C12, sheath capacitances C21, C22, shield capacitances C41, C42, and feedback capacitances C51, C52.

The capacitance values seen from the measuring electronics 50 are:

$$C1 = C11 + C21 + C41$$

$$C2 = C12 + C22 + C42$$

$$C3 = C13 + C23$$

In the circuit shown in FIG. 1, the outputs of the different amplifiers 51, 52, 53, 54 are:

$$U_{Output51} = -U_{vib} - U_{C3} = -U_{vib} - \frac{C3 \times U_t}{C51}$$

$$U_{Output52} = U_{vib} + U_t + U_{C2} + U_{C3} = U_{vib} + U_t + \frac{C3 \times U_t}{C51} + \frac{C2 \times U_t}{C51}$$

$$U_{Output53} = U_{vib} + U_{C2} + U_{C3} = U_{vib} + \frac{C2 \times U_t}{C51} + \frac{C3 \times U_t}{C51}$$

$$U_{Output54} = U_{vib} + U_t \times \frac{C3 + C2/2}{C51}$$

For convenience, we define:

$$C_z = C3 + C2/2$$

It can be seen that variations in the values of the capacitance will have a direct impact on the measured output voltage. From the analysis of the different outputs, a health check can be performed on the various components of the measuring unit. Under normal conditions, the value of the output in the test frequency range will be within the bounds defined by the calibration process. If something is wrong within the entire system, the various possible failures will have recognizable consequences on the values read at the outputs. If C1, C2 or C3 changes the component of the output voltage corresponding to the test signal will change.

Here are only a few examples of the failure identification capabilities of the above described circuit illustrated with some of the most common occurring failures for such systems:

| Failure | C1 & C2 | C3 |
|---|---|---|
| Sensing element disconnects (open circuit in sensor 10) | Unchanged | 0 (MI shielded) C23 (MI unshielded) |
| MTLN disconnected (open circuit MTLN - electronics) | 0 | 0 |
| Saturated amplifiers | | Loss of high frequencies at output |
| Loss of ground connection (between conductor 42 and measuring unit 50) | 0 | Increases |
| Open circuit between MI and MTLN cables | Measure C42 instead of C42 + C22 + C12 | 0 |

In particular, some of these steps may require precise calibrations, others don't. The amount of precision in failure localization can preferably be chosen by the end user. In an even more preferable option, the calibration could be taken far enough to allow the detection of the exact position of a failure. For example a measured value for C2, a value that would correspond to C2-C42/2, could be used to deduce that the failure occurred in the middle of the MTLN cable. These options are left to the preferences of the user of the measuring circuit. For convenience, other differential amplifiers could be added to single out $U_{C2}$ and/or $U_{C3}$ directly and reduce the computational power needed to single them out.

Figure 2:
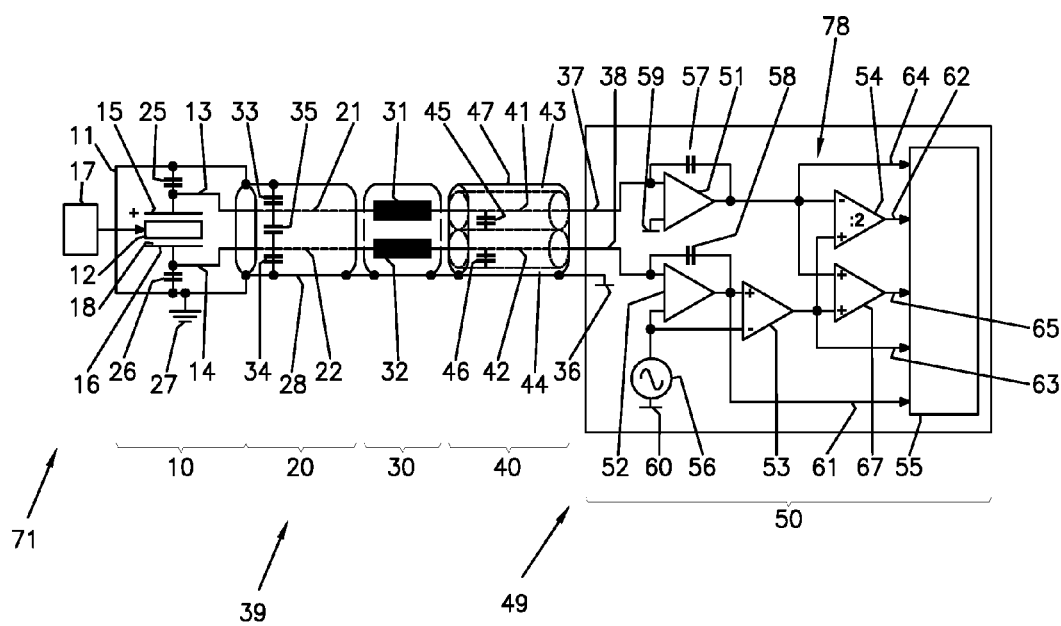
FIG. 2 is a schematic representation of a measuring circuit according to a second embodiment.

FIG. 2 depicts a second embodiment of a measuring circuit 71. Corresponding features with respect to measuring circuit 1 shown in FIG. 1 are denoted with the same reference numerals. Measuring circuit 71 comprises an evaluation circuit 78 in which a summing amplifier 67 is added. Summing amplifier 67 has a first input connected to the output of second upstream amplifier 51 and a second input connected to the output of first downstream amplifier 53. An output of summing amplifier 67 is connected to processing unit 55 via an output channel 65. The output signal of summing amplifier corresponds to $U_{C2}$. Also conceivable is a corresponding assembly providing the value of $U_{C3}$ as an output, or both $U_{C2}$ and $U_{C3}$ as an output, or $U_{Cz}$ as an output, depending on what the user wishes to have direct access to.

Figure 3:
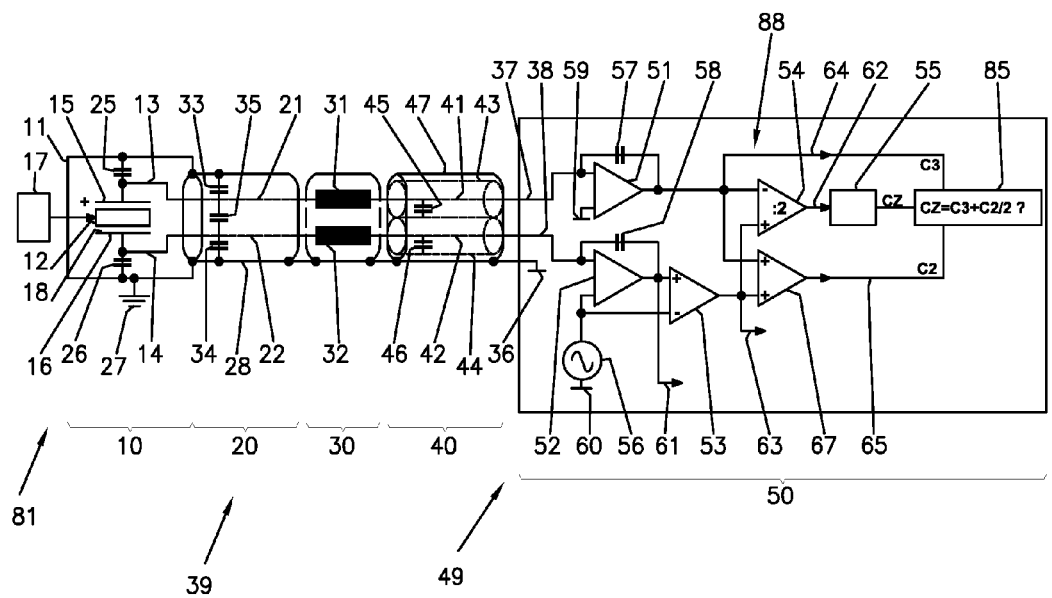
FIG. 3 is a schematic representation of a measuring circuit according to a third embodiment.

FIG. 3 depicts a third embodiment of a measuring circuit 81. Corresponding features with respect to measuring circuit 1 shown in FIG. 1 and measuring circuit 71 shown in FIG. 2 are denoted with the same reference numerals. Measuring circuit 81 comprises an additional logical component 85 added to processing unit 55. Logical component 85 is configured to compare a value derived from a signal at the output of second downstream amplifier 54 with a value derived from a combination of values derived from a signal at the output of summing amplifier 67 and at the output of second upstream amplifier 51.

Measuring circuit 81 builds onto measuring circuit 71 presented in FIG. 2 and allows to provide an additional step to validate the electronics more precisely. Having the output of second upstream amplifier 51 providing a value of C3, the output of summing amplifier 67 providing a value of C2, and the output of first downstream amplifier 53 which gives a value of Cz=C3+C2/2, one can compute the value of Cz using the values obtained for C2 and C3 and check the result. If the result is different, then a problem in the electronics is identified.

Figure 4:
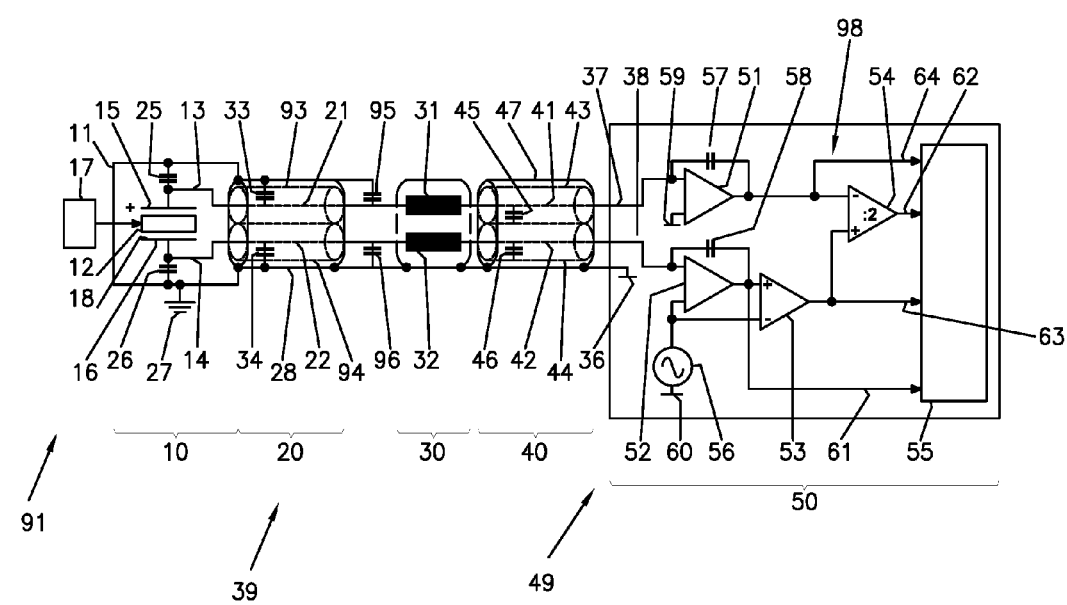
FIG. 4 is a schematic representation of a measuring circuit according to a fourth embodiment.

FIG. 4 depicts a fourth embodiment of a measuring circuit 91. Corresponding features with respect to measuring circuit 1 shown in FIG. 1, measuring circuit 71 shown in FIG. 2, and measuring circuit 81 shown in FIG. 3 are denoted with the same reference numerals. Compared to measuring circuit 1 depicted in FIG. 1, an additional shield 93 is provided around conductor 21 of MI cable 20, and/or an additional shield 94 around conductor 22 of MI cable 20. Moreover, two capacitances 95, 96 are added, each capacitance 95, 96 connecting sheath 28 to a respective conductor 21, 22 of MI cable 20. Capacitances 95, 96 have a respective value of C24 and C25.

In contrast, if the same configuration as in measuring circuit 1 would be used when applying additional shield 93 and/or additional shield 94, though measuring circuit 1 could still determine if there is a failure on the sensor/cable system, there are some cases in which measuring circuit 1 wouldn't be able to determine if the issue came from sensing element 12 and MI cable 20 connected to it, or from MTLN cable 40. For example, an issue at the end of conductor 22, close to output terminal 30, or at the beginning of conductor 42, close to output terminal 30, may result in the same output values. Therefore, and option would be to add capacitances 95, 96 as an additional reference.

Figure 5:
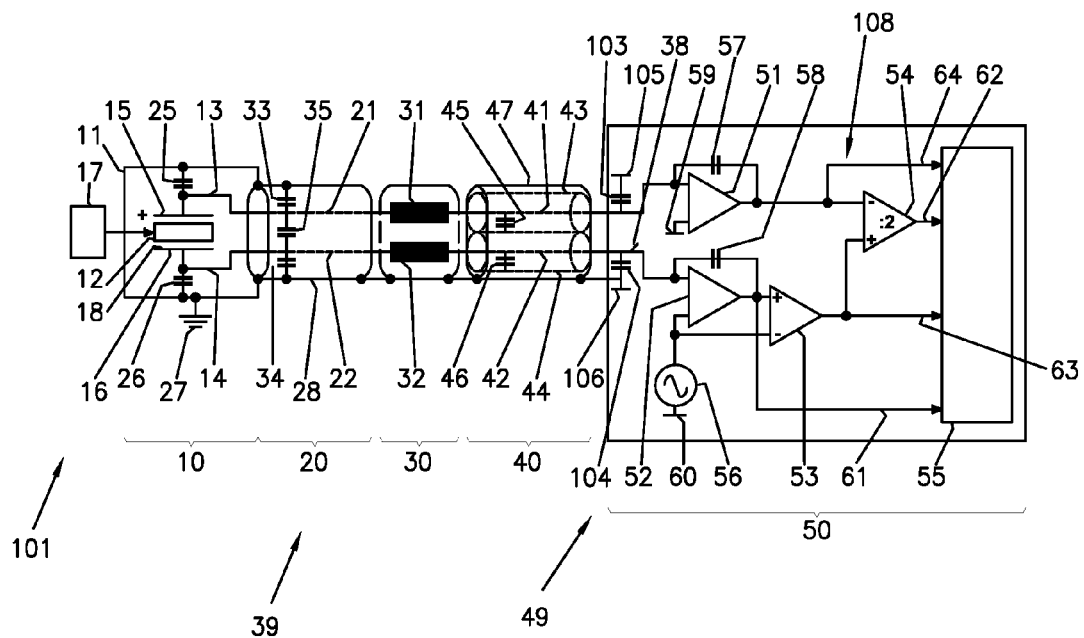
FIG. 5 is a schematic representation of a measuring circuit according to a fifth embodiment.

FIG. 5 depicts a fifth embodiment of a measuring circuit 101. Corresponding features with respect to measuring circuit 1 shown in FIG. 1, measuring circuit 71 shown in FIG. 2, measuring circuit 81 shown in FIG. 3 are denoted with the same reference numerals, and measuring circuit 91 shown in FIG. 4 are denoted with the same reference numerals. Compared to measuring circuit 1 depicted in FIG. 1, measuring circuit 101 comprises an evaluation circuit 108 in which two entry capacitances 103, 104 are added. First entry capacitance 104 is connected to first signal line 38 at the first input of first upstream amplifier 52. Second entry capacitance 103 is connected to second signal line 37 at the first input of second upstream amplifier 51. Each entry capacitance 103, 104 is connected to ground 105, 106. Entry capacitances 103, 104 have a respective value C53, C54.

Figure 6:
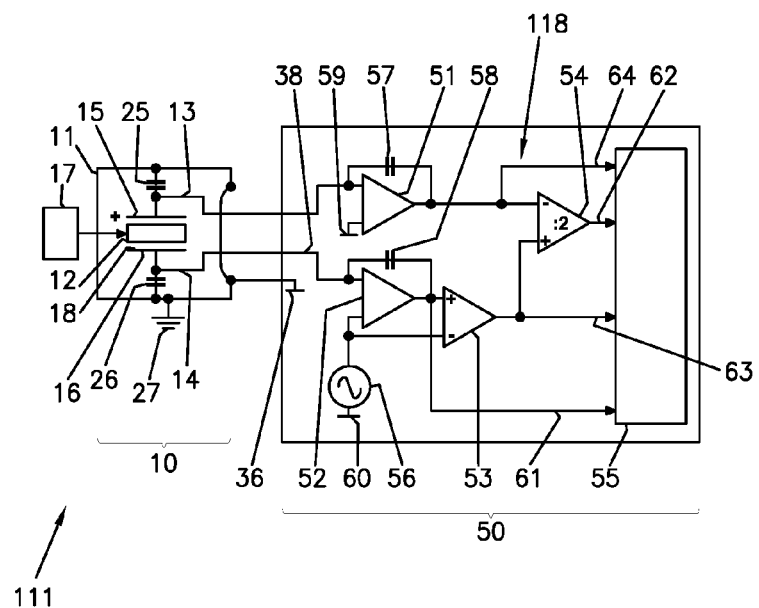
FIG. 6 is a schematic representation of a measuring circuit according to a sixth embodiment.

FIG. 6 depicts a sixth embodiment of a measuring circuit 111. Corresponding features with respect to measuring circuit 1 shown in FIG. 1 are denoted with the same reference numerals. Compared to measuring circuit 1, measuring circuit 111 comprises an evaluation circuit 118 directly connected to the sensing element 12. In particular, no cable is provided in between sensor 10 and electronic measuring unit 50. Thus, substantially no line capacitance, no sheath capacitances and no shield capacitances are present in this circuit. In circuit 111, a failure identification can thus be purely based on a determination and/or monitoring of the value C13 of sensing capacitance 18 and the values C11, C12 of housing capacitances 25, 26. The signal $U_{C3}$ is then directly representative for the sensing capacitance value C13, the signal $U_{C2}$ is then directly representative for the housing capacitance value C12, and the signal $U_{C1}$ is then preferably directly representative for the housing capacitance value C11. In particular, line capacitance value C23, sheath capacitance values C21, C22, and shield capacitance values C41, C42 are nonexistent or negligible in this case. Evaluation circuit 118 and sensing element 12, more particularly sensor 10 and electronic measuring unit 50, are included in a common housing.

An issue on the electronic module can be diagnosed in different ways with the assemblies of the previous methods.

Checking Ut, or checking the Uvib values from second upstream amplifier 51 and first downstream amplifier 53, are two easy ways to do it. However, a quick way to check the entire electronic would be to add entry capacitances 103, 104 as seen in FIG. 5. Entry capacitances 103, 104 are two capacitors arranged at the entry lines of the respective charge amplifier 51, 52. Often, such capacitors would already be present for filtering purposes. These capacitors 103, 104 with their values C53, C54 would appear on the outputs as an additional component adding to the above described values C1 and C2. If not even these capacitors 103, 104 can be detected, then the problem can be attributed to the electronics directly.

The above described measuring circuits represent a further development of the measuring circuits disclosed in U.S. Pat. No. 6,498,501 B2 and 2014/0225634 A1, which are herewith included by reference, and can comprise any other components and/or configurations and/or applications disclosed therein.

From the foregoing description, numerous modifications of the measuring circuit according to the invention are apparent to one skilled in the art without leaving the scope of protection of the invention that is solely defined by the claims.

The invention claimed is:

1. A measuring circuit comprising a sensing element configured to generate a measuring signal from a measuring object, a signal injector configured to generate an auxiliary signal, and an evaluation circuit comprising a first upstream amplifier with a first input connected to a first pole of the sensing element via a first signal line and a second upstream amplifier with a first input connected to a second pole of the sensing element via a second signal line, wherein the first upstream amplifier comprises a second input connected to the signal injector, and the evaluation circuit comprises a first downstream amplifier having a first input connected to the signal injector and a second input connected to an output of the first upstream amplifier.

2. The measuring circuit according to claim 1, wherein the evaluation circuit comprises a second downstream amplifier having a first input connected to an output of the second upstream amplifier, and a second input connected to an output of the first downstream amplifier.

3. The measuring circuit according to claim 1, wherein the second upstream amplifier comprises a second input connected to ground or to a second signal injector.

4. The measuring circuit according to claim 1, wherein at least one of the first upstream amplifier and second upstream amplifier comprises a differential amplifier configured to provide an output signal representative for a difference between an input signal at a first input of the differential amplifier and an input signal at a second input of the differential amplifier.

5. The measuring circuit according to claim 1, wherein the first downstream amplifier comprises a differential amplifier configured to provide an output signal representative for a difference between an input signal at a first input of the differential amplifier and an input signal at a second input of the differential amplifier.

6. The measuring circuit according to claim 4, wherein the first input of the respective differential amplifier corresponds to one of an inverting input delivering an inverted signal and a non-inverting input delivering a non-inverted signal, and the second input of the respective differential amplifier corresponds to the other of the inverting input and the non-inverting input, the signal injector being connected to a different input of said inverting input and non-inverting input at the first downstream amplifier than at the first upstream amplifier.

7. The measuring circuit according to claim 1, wherein the evaluation circuit comprises a summing amplifier with a first input, a second input, and an output providing an output signal representative for a sum of an input signal at the first input and an input signal at the second input, wherein the first input is connected to an output of the second upstream amplifier, and the second input is connected to an output of the first downstream amplifier.

8. The measuring circuit according to claim 1, wherein the measuring circuit comprises a sensing unit including the sensing element, an evaluation unit including the evaluation circuit, and an output terminal, wherein the sensing unit and evaluation unit are connectable to one another via the output terminal.

9. The measuring circuit according to claim 1, wherein the evaluation circuit comprises a processing unit configured with logic to dissociate measurement signals generated by the sensing element from test signals generated by the signal injector.

10. The measuring circuit according to claim 1, wherein the evaluation circuit is configured with logic to evaluate a value derived from a signal obtained downstream of at least one of the first upstream amplifier, the second upstream amplifier, and the first downstream amplifier.

11. The measuring circuit according to claim 7, wherein the evaluation circuit is configured with logic to evaluate a value derived from a signal obtained downstream of the summing amplifier.

12. The measuring circuit according to claim 7, wherein the evaluation circuit is configured with logic to compare a value derived from a signal obtained downstream of the second downstream amplifier with a value derived from a combination of values derived from a signal obtained downstream of the summing amplifier and from a signal obtained downstream of at least one of the first upstream amplifier and second upstream amplifier.

13. The measuring circuit according to claim 1, wherein at least one of the first signal line and second signal line is at least partially provided with a separate electromagnetic shield.

14. The measuring circuit according to claim 1, wherein the evaluation circuit comprises at least one capacitance connected to at least one of said first signal line and second signal line upstream of an input of at least one of said first upstream amplifier and second upstream amplifier.

15. The measuring circuit according to claim 1, wherein the evaluation circuit is configured with logic to evaluate a value derived from a signal obtained downstream of at least one of the first upstream amplifier, the signal corresponding to $$U_{Output52}=U_{vib}+U_t+U_{C2}+U_{C3}, \text{ or } U_{Output52}=-U_{vib}-U_t-U_{C2}-U_{C3};$$

the second upstream amplifier, the signal corresponding to $$U_{Output51}=-U_{vib}-U_{C3}, \text{ or } U_{Output51}=U_{vib}+U_{C3}; \text{ and}$$

the first downstream amplifier, the signal corresponding to $$U_{Output53}=U_{vib}+U_{C2}+U_{C3}, \text{ or } U_{Output53}=-U_{vib}-U_{C2}-U_{C3},$$

wherein $U_{vib}$ corresponds to a signal generated by the sensing element, $U_t$ corresponds to a signal generated by the signal injector, $U_{C2}$ corresponds to a signal representative of a capacitance value C2 of a capacitance in between one of the signal lines and surroundings of this signal line, and $U_{C3}$ corresponds to a signal representative of a capacitance value C3 of a capacitance in between the first signal line and the second signal line.

* * * * *